United States Patent
Corisis et al.

(10) Patent No.: US 7,282,397 B2
(45) Date of Patent: *Oct. 16, 2007

(54) METHODS FOR DESIGNING BOND PAD REROUTING ELEMENTS FOR USE IN STACKED SEMICONDUCTOR DEVICE ASSEMBLIES AND FOR ASSEMBLING SEMICONDUCTOR DEVICES

(75) Inventors: David J. Corisis, Meridian, ID (US);
Jerry M. Brooks, Caldwell, ID (US);
Matt E. Schwab, Boise, ID (US);
Tracy V. Reynolds, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 4 days.

This patent is subject to a terminal disclaimer.

(21) Appl. No.: 11/352,685

(22) Filed: Feb. 13, 2006

(65) Prior Publication Data

US 2006/0166404 A1    Jul. 27, 2006

Related U.S. Application Data

(60) Continuation of application No. 10/646,420, filed on Aug. 22, 2003, now Pat. No. 7,094,631, which is a division of application No. 10/118,366, filed on Apr. 8, 2002.

(51) Int. Cl.
*H01L 21/00* (2006.01)
(52) U.S. Cl. .................. 438/125; 257/E21.499
(58) Field of Classification Search .................. 438/125
See application file for complete search history.

(56) References Cited

U.S. PATENT DOCUMENTS

| 4,341,594 A | 7/1982 | Carlson et al. |
| 4,618,878 A | 10/1986 | Aoyama et al. |
| 4,803,147 A | 2/1989 | Mueller et al. |
| 4,948,754 A | 8/1990 | Kondo et al. |
| 5,049,980 A | 9/1991 | Saito et al. |
| 5,111,279 A | 5/1992 | Pasch |
| 5,168,346 A | 12/1992 | Pasch |
| 5,207,887 A | 5/1993 | Crumly et al. |
| 5,275,973 A | 1/1994 | Gelatos |
| 5,299,730 A | 4/1994 | Pasch et al. |

(Continued)

OTHER PUBLICATIONS

Vardaman, Jan, "What Does a CSP Cost?," Advanced Packaging's Guide to Emerging Technologies, Jul./Aug. 1997 (1 page).

*Primary Examiner*—David A. Zarneke
(74) *Attorney, Agent, or Firm*—TraskBritt, PC

(57) ABSTRACT

A rerouting element for a semiconductor device includes a substantially planar member that carries at least one contact location, at least one conductive, at least one rerouted bond pad. The contact location is positioned adjacent to a first periphered edge of the substantially planar member and at a location that corresponds to the location of a bond pad of a semiconductor device with which the rerouting element is to be used. The at least one conductive element, which communicates with the at least one contact location, reroutes the bond pad location of the semiconductor device to a corresponding rerouted bond pad location adjacent to a second one periphered edge of the rerouted substantially planar member which is opposite the first periphered edge. In addition, assemblies including rerouting elements and methods for designing and using rerouting elements are disclosed.

23 Claims, 5 Drawing Sheets

U.S. PATENT DOCUMENTS

| | | |
|---|---|---|
| 5,323,060 A | 6/1994 | Fogal et al. |
| 5,347,162 A | 9/1994 | Pasch |
| 5,366,906 A | 11/1994 | Wojnarowski et al. |
| 5,384,488 A | 1/1995 | Golshan et al. |
| 5,410,805 A | 5/1995 | Pasch et al. |
| 5,468,681 A | 11/1995 | Pasch |
| 5,489,804 A | 2/1996 | Pasch |
| 5,504,035 A | 4/1996 | Rostoker et al. |
| 5,506,756 A | 4/1996 | Haley |
| 5,527,741 A | 6/1996 | Cole et al. |
| 5,554,887 A | 9/1996 | Sawai et al. |
| 5,565,033 A | 10/1996 | Gaynes et al. |
| 5,569,963 A | 10/1996 | Rostoker et al. |
| 5,658,827 A | 8/1997 | Aulicino et al. |
| 5,672,912 A | 9/1997 | Aoki et al. |
| 5,677,576 A | 10/1997 | Akagawa |
| 5,679,977 A | 10/1997 | Khandros et al. |
| 5,683,942 A | 11/1997 | Kata et al. |
| 5,770,889 A | 6/1998 | Rostoker et al. |
| 5,814,894 A | 9/1998 | Igarashi et al. |
| 5,821,624 A | 10/1998 | Pasch |
| 5,834,799 A | 11/1998 | Rostoker et al. |
| 5,834,844 A | 11/1998 | Akagawa et al. |
| 5,843,798 A | 12/1998 | Matsuda |
| 5,844,304 A | 12/1998 | Kata et al. |
| 5,851,911 A | 12/1998 | Farnworth |
| 5,886,409 A | 3/1999 | Ishino et al. |
| 5,886,415 A | 3/1999 | Akagawa |
| 5,907,787 A | 5/1999 | Sato |
| 5,925,931 A | 7/1999 | Yamamoto |
| 5,946,555 A | 8/1999 | Crumly et al. |
| 5,971,253 A | 10/1999 | Gilleo et al. |
| 5,977,641 A | 11/1999 | Takahashi et al. |
| 6,030,889 A | 2/2000 | Aulicino et al. |
| 6,043,109 A | 3/2000 | Yang et al. |
| 6,054,761 A | 4/2000 | McCormack et al. |
| 6,069,071 A | 5/2000 | Haunuma et al. |
| 6,072,236 A | 6/2000 | Akram et al. |
| 6,117,539 A | 9/2000 | Crotzer et al. |
| 6,132,587 A | 10/2000 | Jorne et al. |
| 6,165,885 A | 12/2000 | Gaynes et al. |
| 6,172,569 B1 | 1/2001 | McCall et al. |
| 6,179,200 B1 | 1/2001 | Kung et al. |
| 6,181,569 B1 | 1/2001 | Chakravorty |
| 6,211,572 B1 | 4/2001 | Fjelstad et al. |
| 6,212,767 B1 | 4/2001 | Tandy |
| 6,228,687 B1 | 5/2001 | Akram et al. |
| 6,233,184 B1 | 5/2001 | Barth et al. |
| 6,255,737 B1 | 7/2001 | Hashimoto |
| 6,284,563 B1 | 9/2001 | Fjelstad |
| 6,285,203 B1 | 9/2001 | Akram et al. |
| 6,294,407 B1 | 9/2001 | Jacobs |
| 6,306,680 B1 | 10/2001 | Fillion et al. |
| 6,319,810 B1 | 11/2001 | Ochai et al. |
| 6,334,249 B2 | 1/2002 | Hsu |
| 6,343,171 B1 | 1/2002 | Yoshimura et al. |
| 6,348,731 B1 | 2/2002 | Ashley et al. |
| 6,376,904 B1 | 4/2002 | Haba et al. |
| 6,392,306 B1 | 5/2002 | Khandros et al. |
| 6,434,017 B1 | 8/2002 | Iwabuchi |
| 6,458,231 B1 | 10/2002 | Wapner et al. |
| 6,475,896 B1 | 11/2002 | Hashimoto |
| 6,492,200 B1 | 12/2002 | Park et al. |
| 6,515,370 B2 | 2/2003 | Hashimoto |
| 6,534,853 B2 | 3/2003 | Liu et al. |
| 6,573,609 B2 | 6/2003 | Fjelstad |
| 6,590,292 B1 | 7/2003 | Barber et al. |
| 7,094,631 B2 * | 8/2006 | Corisis et al. ............. 438/109 |
| 2001/0006759 A1 | 7/2001 | Shipley, Jr. et al. |
| 2003/0038378 A1 | 2/2003 | Jacobs |

* cited by examiner

METHODS FOR DESIGNING BOND PAD REROUTING ELEMENTS FOR USE IN STACKED SEMICONDUCTOR DEVICE ASSEMBLIES AND FOR ASSEMBLING SEMICONDUCTOR DEVICES

CROSS-REFERENCE TO RELATED APPLICATIONS

This application is a continuation of application Ser. No. 10/646,420, filed Aug. 22, 2003, now U.S. Pat. No. 7,094,631, issued on Feb. 14, 2006, which is a divisional of application Ser. No. 10/118,366, filed Apr. 8, 2002, pending.

BACKGROUND OF THE INVENTION

1. Field of the Invention

The present invention relates generally to elements that reroute the locations of bond pads on semiconductor devices and, more specifically, to rerouting elements that are configured to be secured to the active surfaces of fabricated semiconductor devices to reroute the bond pad locations thereof. In addition, the present invention relates to methods for designing rerouting elements and to rerouting methods. The present invention also relates to multi-chip modules with semiconductor devices in stacked arrangement and including one or more of the rerouted semiconductor devices, as well as to methods for forming and packaging such assemblies.

2. Background of Related Art

In order to conserve the amount of surface area, or "real estate," consumed on a carrier substrate, such as a circuit board, by semiconductor devices connected thereto, various types of increased density packages have been developed. Among these various types of packages is the so-called "multi-chip module" (MCM). Some types of multi-chip modules include assemblies of semiconductor devices that are stacked one on top of another. The amount of surface area on a carrier substrate that may be saved by stacking semiconductor devices is readily apparent—a stack of semiconductor devices consumes roughly the same amount of real estate on a carrier substrate as a single, horizontally oriented semiconductor device or semiconductor device package.

Due to the disparity in processes that are used to form different types of semiconductor devices (e.g., the number and order of various process steps), the incorporation of different types of functionality into a single semiconductor device has proven very difficult to actually reduce to practice. Even in cases where semiconductor devices that carry out multiple functions can be fabricated, multi-chip modules that include semiconductor devices with differing functions (e.g., memory, processing capabilities, etc.) are often much more desirable since the separate semiconductor devices may be fabricated independently and later assembled with one another much more quickly and cost-effectively (e.g., lower production costs due to higher volumes and lower failure rates).

Multi-chip modules may also contain a number of semiconductor devices that perform the same function, effectively combining the functionality of all of the semiconductor devices thereof into a single package.

An example of a conventional, stacked multi-chip module includes a carrier substrate, a first, larger semiconductor device secured to the carrier substrate, and a second, smaller semiconductor device positioned over and secured to the first semiconductor device. Any suitable adhesive may be used to secure the semiconductor devices to one another. The second semiconductor device does not overlie bond pads of the first semiconductor device and, thus, the second semiconductor device does not cover bond wires that electrically connect bond pads of the first semiconductor device to corresponding contacts or terminal pads of the carrier substrate. Such a multi-chip module is disclosed and illustrated in U.S. Pat. No. 6,212,767, issued to Tandy on Apr. 10, 2001 (hereinafter "the '767 patent"). Due to the use of bond wires to form electrical connections between bond pads and corresponding terminal pads, this type of stacked multi-chip module has been limited to use with semiconductor devices that include peripherally located bond pads.

U.S. Pat. No. 5,323,060, issued to Fogal et al. on Jun. 21, 1994 (hereinafter "the '060 patent") shows one example where dice of the same size are stacked on top of one another over a circuit board. Bonding wires are connected from the bond pads of each die to corresponding terminal pads on the circuit board. In order to provide clearance for the bond wires that electrically connect bond pads and corresponding terminal pads, however, adjacent semiconductor devices must be spaced apart from one another a significant distance.

Stacked multi-chip modules of other configurations have also been developed. For example, it is known that stacked multi-chip modules may include large semiconductor devices positioned over smaller semiconductor devices and that adjacent semiconductor devices may be staggered relative to one another or have different orientations.

Different electrical connection technologies, including wire bonding, tape-automated bonding ("TAB"), and controlled-collapse chip connection ("C-4"), which results in a so-called flip-chip arrangement, are but a few of the ways in which discrete conductive elements may be formed in stacked multi-chip modules. Different electrical connection technologies have also been used in single multi-chip modules, with the bond pads of one semiconductor device being electrically connected to corresponding contact areas of a carrier substrate of the multi-chip module with a different type of discrete conductive element than that used to form electrical connections between the bond pads of another semiconductor device and their corresponding contact areas of the carrier substrate.

Many semiconductor devices include bond pads that are arranged at central locations on an active surface thereof. Examples include semiconductor devices that are configured for use with leads-over-chip (LOC) type lead frames, in which the bond pads are arranged substantially linearly along the centers thereof, as well as semiconductor devices with bond pads disposed in an "I" arrangement. While it may be desirable to use such semiconductor devices in stacked multi-chip modules, the central bond pad placements thereof do not readily facilitate the use of bond wires or other laterally extending discrete conductive elements to electrically connect the bond pads with their corresponding terminal pads of a circuit board that underlies the semiconductor device stack.

Accordingly, there are needs for apparatus and methods that facilitate the use of semiconductor devices with centrally located bond pads in stacked multi-chip modules. There are also needs for apparatus and methods for reducing the heights of stacked multi-chip modules that include semiconductor devices with peripherally located bond pads.

SUMMARY OF THE INVENTION

A rerouting element incorporating teachings of the present invention includes a substantially planar member, referred to herein as a base substrate, with opposed top and bottom surfaces. The base substrate of the rerouting element carries electrically conductive vias, or contacts, that are exposed to the bottom surface thereof and arranged to mirror a footprint of one or more bond pads on a surface of a semiconductor device, such as an LOC type semiconductor device or a semiconductor device with peripherally arranged bond pads, to which the rerouting element is to be secured.

Each electrically conductive via of the rerouting element communicates with a corresponding conductive trace thereof. The conductive traces of the rerouting element may be carried internally within the substantially planar member, externally on the top or bottom surface thereof, or in some combination thereof. Each conductive trace leads to a corresponding reroute location on the base substrate, at which a contact pad is positioned. Upon assembly of the rerouting element with a semiconductor device complementary thereto, the contact pads of the rerouting element will be located at desired positions relative to an active surface of the semiconductor device.

A rerouted semiconductor device according to the present invention includes a semiconductor device with one or more bond pads on a surface thereof and a rerouting element with electrically conductive vias that are positioned to align with corresponding bond pads of the semiconductor device. The rerouting element is positioned over a bond pad-bearing surface of the semiconductor device with electrically conductive vias of the rerouting element and corresponding bond pads of the semiconductor device in alignment and electrically communicating with one another. The rerouting element is secured to the bond pad-bearing surface of the semiconductor device with the conductive traces and contact pads of the rerouting element being electrically isolated from underlying structures of the semiconductor device.

When used in an assembly of stacked semiconductor devices, the rerouted semiconductor device may facilitate the positioning of one or more other semiconductor devices over a central region (i.e., the locations of substantially centrally positioned bond pads) thereof. In addition, a rerouted semiconductor device that incorporates teachings of the present invention may facilitate the use of shorter discrete conductive elements to connect rerouted bond pads to corresponding contact areas of a carrier substrate than would otherwise be required to connect more centrally located bond pads to their corresponding contact areas.

Alternatively, the use of a rerouting element that incorporates teachings of the present invention may facilitate the use of semiconductor devices with peripherally located bond pads in assemblies which include semiconductor devices that are stacked in staggered arrangement relative to one another.

A semiconductor device assembly incorporating teachings of the present invention includes a first, rerouted semiconductor device and a second semiconductor device positioned over the first, rerouted semiconductor device. When the first and second semiconductor devices are assembled with one another, the rerouted bond pads of the first, rerouted semiconductor device may be exposed beyond an outer periphery of the second semiconductor device. Accordingly, the second semiconductor device may have smaller dimensions than those of the first semiconductor device. Alternatively, the lateral position of the second semiconductor device may be staggered relative to the position of the first, rerouted semiconductor device, or only partially superimposed over the first semiconductor device. Such a semiconductor device assembly may also include a carrier substrate, such as a circuit board, an interposer, another semiconductor device, or leads. Contact areas of the carrier substrate correspond to rerouted bond pads of the first, rerouted semiconductor device, as well as to bond pads of the second semiconductor device. Discrete conductive elements, such as wire bonds, conductive tape-automated bond (TAB) elements carried by a dielectric substrate, or leads, may electrically connect bond pads of the first and second semiconductor devices to corresponding contact areas of a carrier substrate.

Methods for designing rerouting elements are also within the scope of the present invention, as are methods for forming rerouted semiconductor devices, methods for assembling semiconductor devices in stacked relation, and methods for packaging semiconductor devices.

Other features and advantages of the present invention will become apparent to those of ordinary skill in the art through consideration of the ensuing description, the accompanying drawings, and the appended claims.

BRIEF DESCRIPTION OF THE SEVERAL VIEWS OF THE DRAWINGS

In the drawings, which illustrate exemplary embodiments of various aspects of the present invention.

DETAILED DESCRIPTION OF THE INVENTION

Figure 1:
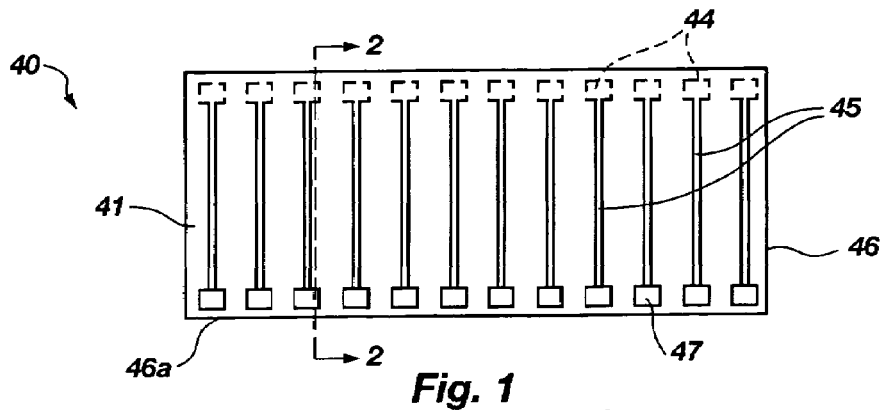
FIG. 1 is a top view of an exemplary embodiment of rerouting element incorporating teachings of the present invention.
Figure 2:
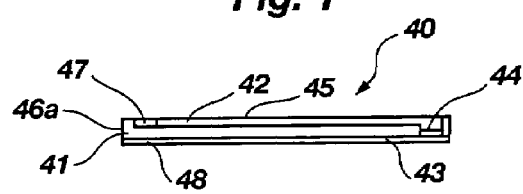
FIG. 2 is a cross-section taken along line 2-2 of FIG. 1.

FIGS. 1 and 2 depict an exemplary embodiment of a rerouting element 40, which is configured to be disposed on an active surface 32 of a semiconductor device 30 (FIGS. 3 and 4) and to reroute bond pad 34 locations of semiconductor device 30. Rerouting element 40 includes a base substrate 41 with a top side 42 and a bottom side 43, electrically conductive vias 44 exposed at bottom side 43 and extending toward top side 42, at least partially through base substrate 41, conductive traces 45 carried by base substrate 41 and extending from a corresponding electrically conductive via 44 toward an outer periphery 46 of base substrate 41 to contact pads 47 located adjacent to outer periphery 46 of base substrate 41 and exposed at top side 42 thereof. While contact pads 47 are depicted as being located adjacent to a single peripheral edge 46a of base substrate 41, rerouting elements that include contact pads positioned proximate to two adjacent edges of the base substrates thereof are also within the scope of the present invention.

As base substrate 41 of rerouting element 40 is configured to be disposed on active surface 32 of semiconductor device 30, base substrate 41 need only have sufficient dimensions to cover active surface 32 or a portion thereof.

Base substrate 41 may be formed from a dielectric material, such as a nonconductive polymer (e.g., polyimide). In addition, base substrate 41 may comprise a flexible, relatively thin, substantially planar member, enabling base substrate 41 to minimize package height and, as desired, to conform somewhat to surfaces that are located at different elevations (e.g., the different elevations of a multi-chip module). It is currently preferred that base substrate 41 comprise a flex tape, such as that used to fabricate a TAB element. Alternatively, base substrate 41 may comprise a substantially planar member formed from any other dielectric material (e.g., glass, ceramic, etc.) or at least partially dielectric-coated semiconductor material or even a dielectric-coated metal if heat transfer is to be facilitated.

As an example and not to limit the scope of the present invention, electrically conductive vias 44 may comprise conductive bumps, such as bumps of solder, gold, or another suitable metal or metal alloy. Alternatively, conductive vias 44 may comprise columns, pillars, or other structures that are formed from a suitable, electrically conductive material, such as a conductive or conductor-filled epoxy or an anisotropically conductive (z-axis) elastomer.

Conductive traces 45 may, by way of example only, be formed from a low electrical resistance, electrically conductive material, such as aluminum or copper.

Each conductive trace 45 of rerouting element 40 may extend either internally through or externally across base substrate 41. Alternatively, each conductive trace 45 may include one or more internally and externally carried portions. While it is preferred that any external portions of conductive traces 45 be carried on top side 42 of base substrate 41, conductive traces 45 or portions thereof may also be exposed to bottom side 43.

While conductive traces 45 may be nonlinear, some or all of conductive traces 45 may alternatively provide the shortest possible path length between a corresponding electrically conductive via 44 and contact pad 47. Accordingly, substantially straight conductive traces 45 are within the scope of the present invention. As another option, conductive traces 45 may be of substantially the same length to match impedance and signal speed.

Adjacent conductive traces 45 are preferably electrically isolated from one another, either by being spaced apart from one another on base substrate 41 or by the material of base substrate 41 located therebetween. In addition, conductive traces 45 may be positioned, oriented, and spaced on base substrate 41 relative to one another in such a manner as to reduce or eliminate any electrical interference therebetween. Conductive traces 45 of rerouting element 40 may be parallel or nonparallel to one another.

Contact pads 47 are carried upon either top side 42 of base substrate 41 at or adjacent to a peripheral edge 46a thereof or on peripheral edge 46a. Such positioning of contact pads 47 facilitates access thereto by equipment that will secure discrete conductive elements 56 (FIG. 8) to contact pads 47 (e.g., a wire bonding capillary, ultrasonic bonding equipment, thermocompression bonding equipment, etc.).

Figure 3:
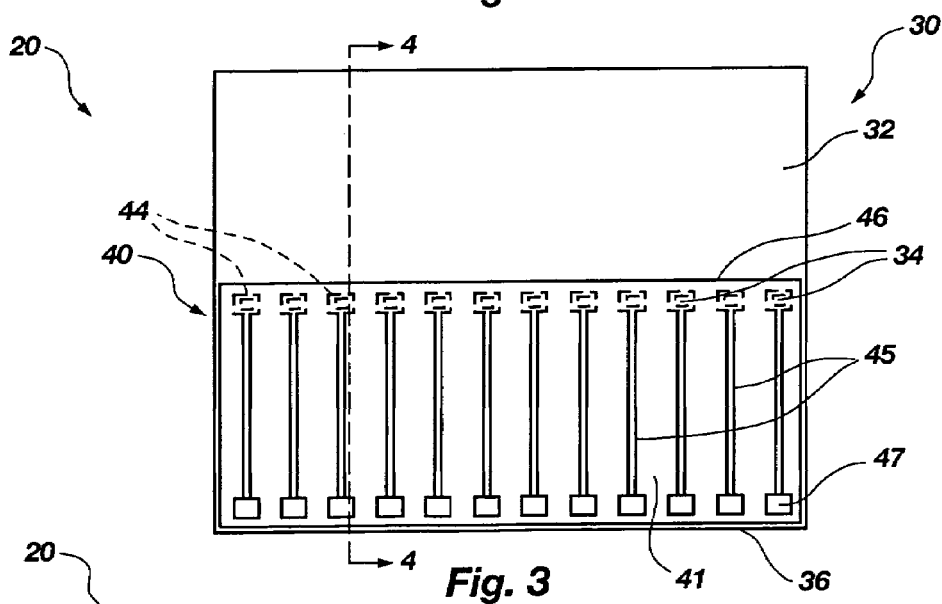
FIG. 3 is a top view of an assembly including the rerouting element of FIGS. 1 and 2 and a semiconductor device with centrally located bond pads.
Figure 4:
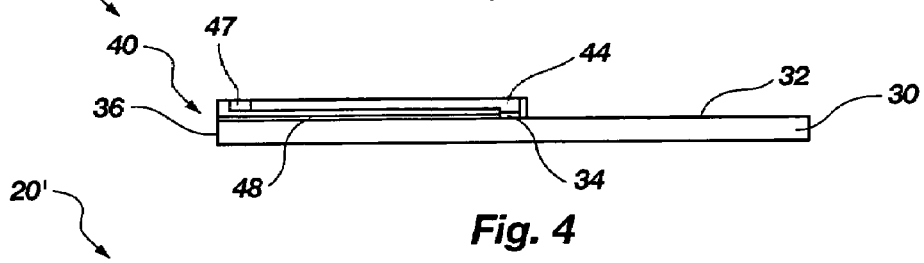
FIG. 4 is a cross-section taken along line 4-4 of FIG. 3.

Portions of base substrate 41 that underlie conductive traces 45 may electrically isolate conductive traces 45 from an active surface 32 of an underlying semiconductor device 30 (FIGS. 3 and 4). Alternatively, or in addition, at least portions of bottom side 43 of base substrate 41 may be coated with an adhesive material 48, such as a thermoset resin or a pressure-sensitive adhesive. Such a coating of adhesive material 48 may facilitate securing of rerouting element 40 to an active surface 32 of a semiconductor device 30 (FIGS. 3 and 4). Adhesive material 48 may also electrically insulate conductive traces 45 and contact pads 47 from underlying features of a semiconductor device 30 upon which rerouting element 40 is positioned, or provide an additional insulative layer or standoff distance that decreases or eliminates any electrical interference that may occur between semiconductor device 30 and conductive traces 45 or contact pads 47.

A rerouted semiconductor device 20 that includes a rerouting element 40 and a semiconductor device 30 is illustrated in FIGS. 3 and 4. Semiconductor device 30 includes centrally located bond pads 34 on active surface 32 thereof. As depicted, bond pads 34 are arranged in a substantially linear manner, in a so-called leads-over-chip (LOC) configuration.

Rerouting element 40 is positioned on active surface 32, over bond pads 34 and adjacent to at least one peripheral edge 36 of semiconductor device 30. Rerouting element 40 may be secured to active surface 32 by way of adhesive material 48.

Electrically conductive vias 44 of rerouting element 40, which are positioned adjacent a peripheral edge 46a of base substrate 41, align with corresponding bond pads 34 so that electrical connections may be established therewith. By way of example only, electrical connections and, thus, electrical communication may be established by way of physical contact between electrically conductive vias 44 and their corresponding bond pads 34. Alternatively, discrete connective elements formed from a conductive material, such as solder, conductive or conductor-filled epoxy, or anisotropically conductive (z-axis) elastomer, may physically and electrically connect each electrically conductive via 44 of rerouting element 40 to its corresponding bond pad 34 of semiconductor device 30.

Upon positioning rerouting element 40 on active surface 32 and aligning electrically conductive vias 44 with their corresponding bond pads 34, contact pads 47 of rerouting element 40 are located adjacent to peripheral edge 36 of semiconductor device 30. Thus, each electrically conductive via 44, along with its corresponding conductive trace 45 and contact pad 47, reroutes a corresponding bond pad 34 on active surface 32 of semiconductor device 30 from a central location to the more peripheral location at which contact pad 47 is positioned.

Figure 4A:
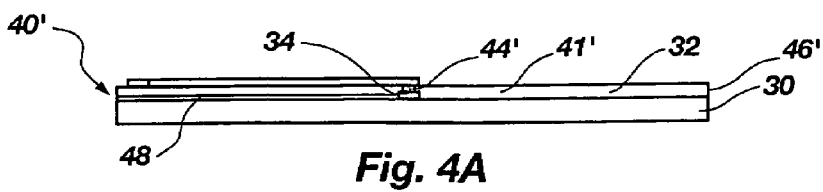
FIG. 4A is a cross-sectional representation depicting another exemplary embodiment of rerouting element, which is configured to substantially cover a surface of a semiconductor device.

FIG. 4A depicts a variation of rerouted semiconductor device 20', which includes a semiconductor device 30 and a variation of rerouting element 40' on active surface 32 thereof. Rerouting element 40' includes a base substrate 41' that is sized to be superimposed over a greater area of active surface 32 than base substrate 41 of rerouting element 40. As shown, electrically conductive vias 44' of rerouting element 40' are positioned centrally with respect to base substrate 41', rather than adjacent to a peripheral edge 46' thereof. As will be seen from the ensuing description, a rerouting element 40' of this configuration may support another semiconductor device 30 superimposed thereover with greater stability than rerouting element 40, particularly if base substrates 41 and 41' are fairly thick.

Figure 5:
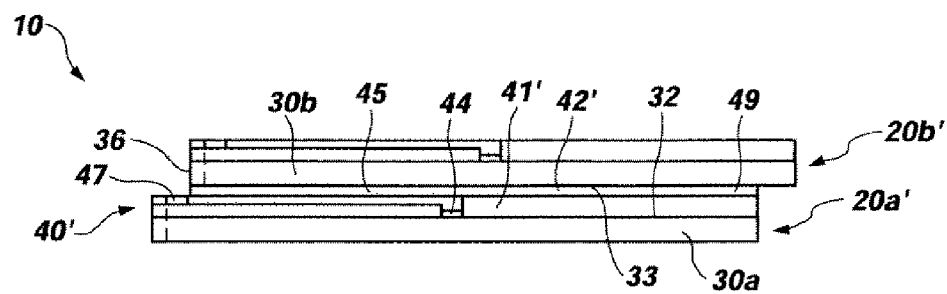
FIG. 5 is a side view of a stacked two-semiconductor device assembly including semiconductor devices and rerouting elements of the type illustrated in FIG. 4A.

Referring now to FIG. 5, a semiconductor device assembly 10 is shown that includes two rerouted semiconductor devices 20a', 20b' in stacked, or superimposed, relation. As shown, the upper semiconductor device 20b' is staggered relative to the next-lower rerouted semiconductor device 20a', with contact pads 47 of rerouted semiconductor device 20a' being exposed laterally beyond an outer periphery 36 of semiconductor device 30b and, thus, beyond an outer periphery of rerouted semiconductor device 20b'.

A back side 33 of the semiconductor device 30b of the upper rerouted semiconductor device 20b' is spaced apart from active surface 32 of the semiconductor device 30a of the lower rerouted semiconductor device 20a', at least in part, by way of rerouting element 40'. Back side 33 of semiconductor device 30b is secured to a top side 42' of base substrate 41' and, thus, of rerouting element 40' by way of dielectric adhesive material 49 therebetween.

Electrically conductive vias 44 and any externally carried portions of conductive traces 45 that extend between the adjacent semiconductor devices 30a and 30b may be electrically isolated from back side 33 of the upper semiconductor device 30b by way of dielectric adhesive material 49 that secures back side 33 to top side 42'. Alternatively, the material of base substrate 41' may electrically isolate electrically conductive vias 44 and conductive traces 45 from back side 33 when electrically conductive vias 44 do not extend fully through the thickness of base substrate 41' and the portions of conductive traces 45 that are located between semiconductor devices 30a and 30b are carried internally by base substrate 41'. Of course, electrically conductive vias 44 and conductive traces 45 may also be electrically isolated from back side 33 of the next-higher semiconductor device 30b by any combination of dielectric adhesive material 49 and base substrate 41' material.

Figure 6:
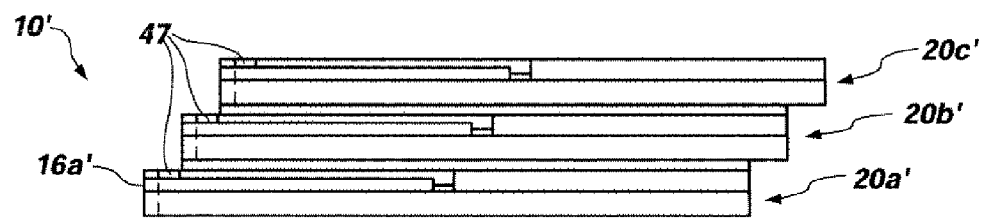
FIG. 6 is a side view of an exemplary stacked arrangement of an assembly that includes three semiconductor devices and rerouting elements of the type illustrated in FIG. 4A.
Figure 7:
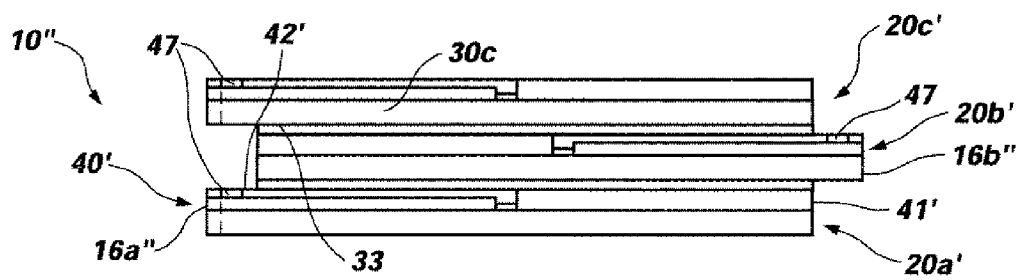
FIG. 7 is a side view of another exemplary stacked arrangement of an assembly that includes three semiconductor devices and rerouting elements of the type illustrated in FIG. 4A.

FIGS. 6 and 7 illustrate stacked semiconductor device assemblies 10' and 10", respectively, which include more than two rerouted semiconductor devices 20'. In FIG. 6, contact pads 47 of each rerouted semiconductor device 20a', 20b', 20c' are positioned adjacent the same peripheral edge 16a' of assembly 10'. Rerouted semiconductor devices 20a', 20b', 20c' are progressively staggered to facilitate the securing of discrete conductive elements 56 (FIG. 8) to each contact pad 47.

Assembly 10" of FIG. 7 includes rerouted semiconductor devices 20a', 20b', 20c' that are arranged with contact pads 47 of the upper and lower rerouted semiconductor devices 20c' and 20a' being positioned adjacent to the same peripheral edge 16a" of assembly 10" and contact pads 47 of the central rerouted semiconductor device 20b' being positioned adjacent to an opposite peripheral edge 16b" of assembly 10". To facilitate electrical connection to contact pads 47 of each rerouted semiconductor device 20a', 20b', 20c', rerouted semiconductor devices 20a', 20b', 20c' are arranged in repeating staggered relation. Stated another way, while rerouted semiconductor device 20b' is only partially superimposed over rerouted semiconductor device 20a', rerouted semiconductor device 20c' is completely superimposed over rerouted semiconductor device 20a'. The distance between contact pads 47 of the lowermost rerouted semiconductor device 20a' and back side 33 of semiconductor device 30c of the uppermost rerouted semiconductor device 20c' may be sufficient to provide access by discrete conductive element positioning or forming equipment (e.g., a wire bonding capillary, thermocompression bonding equipment, ultrasonic bonding equipment, etc.) to contact pads 47 of rerouted semiconductor device 20a'. In any event, the spacing between top side 42' of the base substrate 41' of rerouting element 40' of rerouted semiconductor device 20a' and back side 33 of semiconductor device 30c of rerouted semiconductor device 20c' is sufficient for discrete conductive elements 56 (FIG. 8) to extend therebetween.

Figure 8:
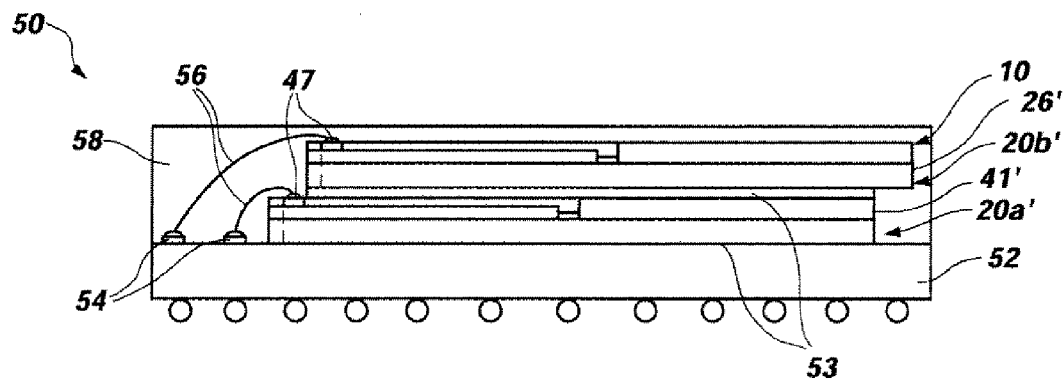
FIG. 8 is a cross-sectional representation of a multi-chip module including the assembly of FIG. 5, a carrier substrate, an encapsulant, and external connective elements.

As shown in FIG. 8, a semiconductor device package 50 including assembly 10 is depicted. In package 50, rerouted semiconductor device 20a' of assembly 10 is secured to a carrier substrate 52, such as the depicted circuit board, an interposer, another semiconductor device, or leads of a lead frame. Contact pads 47 of rerouted semiconductor devices 20a' and 20b' are electrically connected to, or communicate with, corresponding contact areas 54 of carrier substrate 52 by way of discrete conductive elements 56, such as the depicted bond wires, conductive traces carried upon a flexible dielectric substrate to form a TAB element, thermocompression or ultrasonically bonded leads, or the like, that extend therebetween. Package 50 may also include a protective encapsulant 58 that may surround rerouted semiconductor devices 20a' and 20b', discrete conductive elements 56, and portions of carrier substrate 52 located adjacent to rerouted semiconductor device 20a'. By way of example only, protective encapsulant 58 may comprise a molded structure (e.g., a pot molded or transfer molded structure) or a so-called "glob top" type structure of viscous dielectric material.

Figure 9:
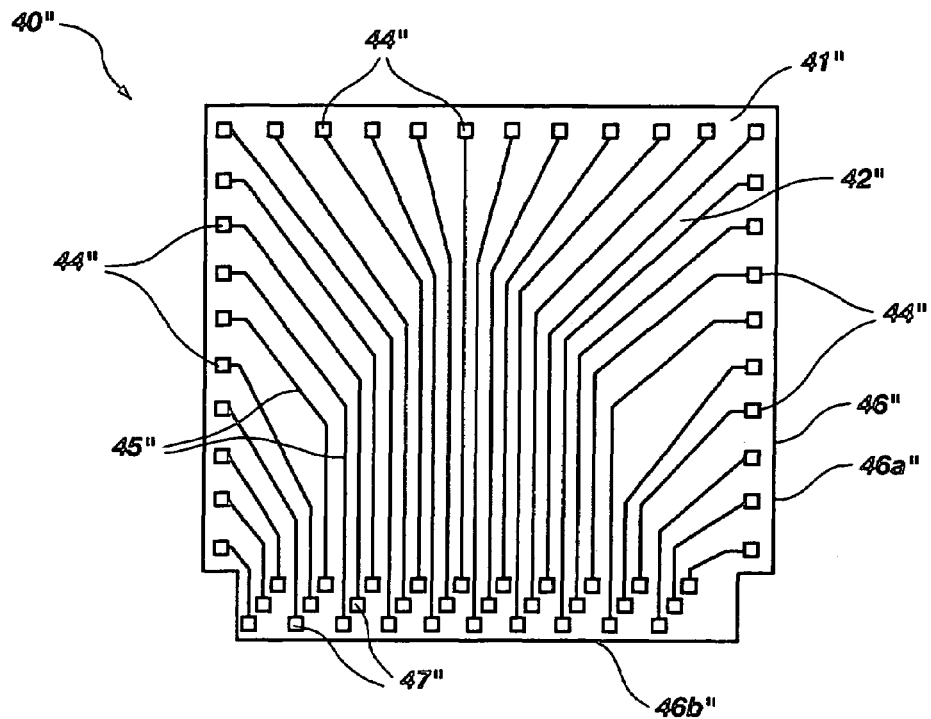
FIG. 9 is a top view of another exemplary embodiment of rerouting element, which is configured to reroute peripherally located bond pads of a semiconductor device toward a single edge or two adjacent edges of the semiconductor device.

FIG. 9 depicts another example of a routing element 40" for use with a semiconductor device that includes bond pads positioned adjacent to more than one peripheral edge thereof to reroute the locations of the bond pads of such a semiconductor device to locations adjacent one peripheral edge or two adjacent peripheral edges of the semiconductor device.

Rerouting element 40" is configured similarly to rerouting elements 40 and 40', but includes electrically conductive vias 44" that are positioned adjacent an outer periphery 46" of base substrate 41" at locations on top side 42" thereof that correspond to the locations of bond pads on the active surface of the semiconductor device over which rerouting element 40" is to be positioned. Of course, conductive traces 45" of rerouting element 40" extend from corresponding electrically conductive vias 44" to contact pads 47" positioned adjacent either one peripheral edge 46b" or two adjacent peripheral edges 46a", 46b" of base substrate 41".

A rerouted semiconductor device including rerouting element 40" may be assembled with one or more other rerouted semiconductor devices 20", 20', or other semiconductor devices that include bond pads that are each positioned adjacent to either a single peripheral edge thereof or two adjacent peripheral edges thereof in a manner similar to the assemblies depicted in FIGS. 5-7.

As rerouting element 40" reroutes bond pads from locations that are adjacent to three or four peripheral edges thereof to locations that are adjacent to one or two peripheral edges thereof, stacked assemblies of decreased height may be achieved when rerouting element 40" is used. This can be seen in FIGS. 11-13, which, although described in terms of rerouting element 40''' of FIG. 10, depict an exemplary staggered stacking arrangement that can be used when a rerouting element 40'' with contact pads 47'' adjacent to one or two peripheral edges 46a'', 46b'' thereof is used with a semiconductor device that includes bond pads arranged around three or four peripheral edges thereof.

Figure 10:
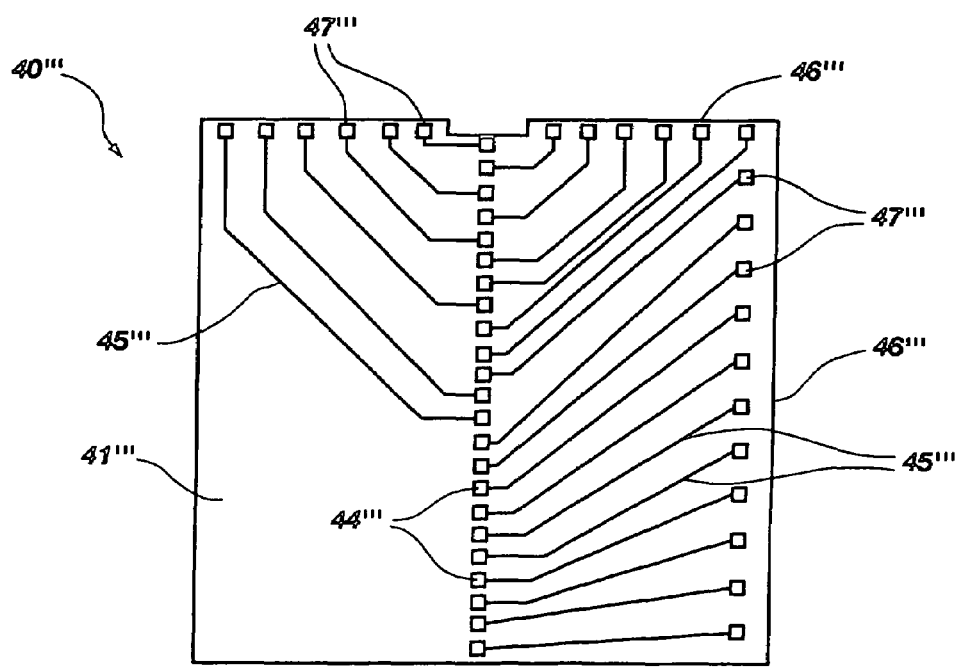
FIG. 10 is a top view of yet another exemplary embodiment of rerouting element.

Turning now to FIG. 10, another exemplary embodiment of rerouting element 40''' is depicted. Rerouting element 40''' includes a base substrate 41''', electrically conductive vias 44''', conductive traces 45''' and contact pads 47''' that are substantially the same as the corresponding elements of rerouting elements 40 and 40' (FIGS. 1-8). Again, electrically conductive vias 44''' are positioned correspondingly to bond pads 34 positioned centrally on an active surface 32 of a semiconductor device 30 over which rerouting element 40''' is to be positioned. However, contact pads 47''' of rerouting element 40''' are positioned adjacent to more than one peripheral edge 46''' of base substrate 41'''.

Figure 11:
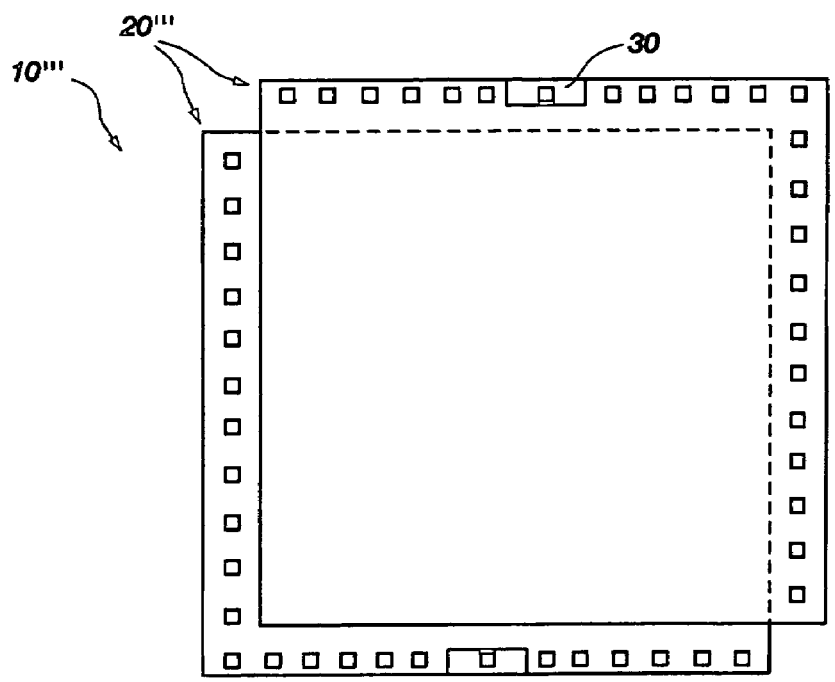
FIG. 11 is a top view of a stacked assembly including semiconductor devices and rerouting elements of the type depicted in FIG. 10.

Rerouted semiconductor devices 20''' formed by assembling rerouting elements 40''' with complementarily configured semiconductor devices 30 may be used in any appropriate, known type of semiconductor device assembly or multi-chip module, such as in the stacked assembly 10''' depicted in FIG. 11.

Figure 12:
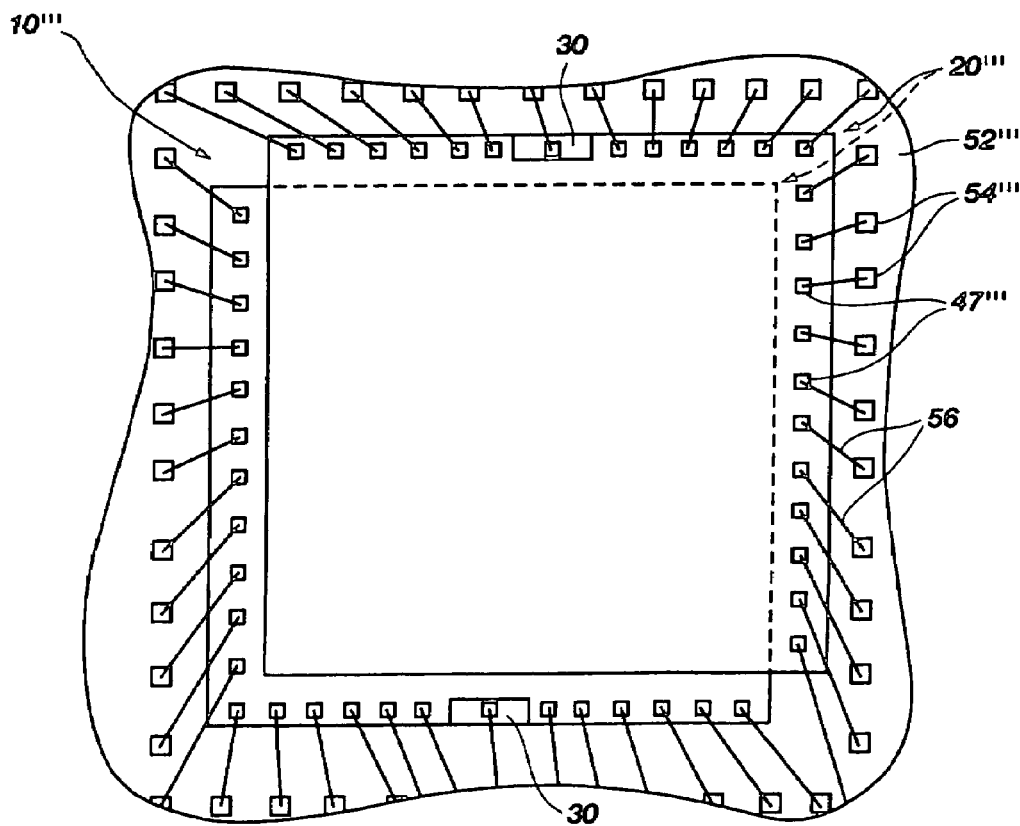
FIG. 12 depicts the assembly of FIG. 11 secured and electrically connected to a carrier substrate.

FIG. 12 depicts stacked assembly 10''' secured to a carrier substrate 52''' in an exemplary fashion. Although carrier substrate 52''' is shown as comprising an interposer, it may alternatively be in the form of a circuit board, a lead frame, another semiconductor device, or any other suitable substrate known in the art. Contact areas 54''' of carrier substrate 52''' may communicate with corresponding contact pads 47''' of each rerouted semiconductor device 20''' or other semiconductor device of assembly 10''' by way of discrete conductive elements 56 (e.g., bond wires, TAB elements, thermocompression or ultrasonically bonded leads, etc.) placed or formed therebetween. Of course, it is preferred that discrete conductive elements 56 be electrically isolated from one another, as well as from any other structures (e.g., semiconductor devices 30) over which they extend.

Figure 13:
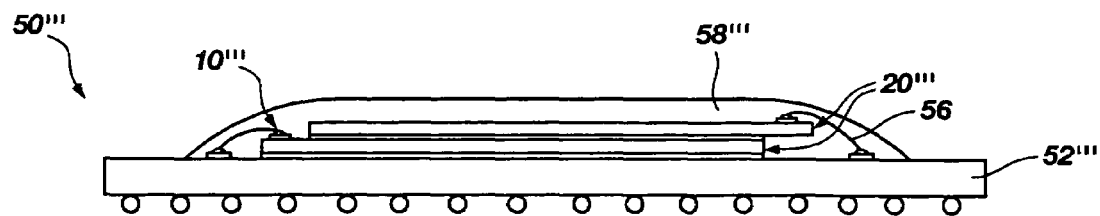
FIG. 13 is a cross-sectional representation of a multi-chip module including the assembly of FIG. 12, an encapsulant, and external connective elements.

As shown in FIG. 13, stacked assembly 10''' and carrier substrate 52''' may be incorporated into a package 50'''. Package 50''' may also include a protective encapsulant 58''' that covers at least portions of each rerouted semiconductor device 20''' or other semiconductor device of assembly 10''', discrete conductive elements 56, and regions of carrier substrate 52''' that are located proximate an outer periphery of assembly 10'''. Protective encapsulant 58''' may comprise a glob top type encapsulant, as depicted, or any other known type of semiconductor device encapsulant, such as a pot molded encapsulant or a transfer molded encapsulant.

Referring again to FIGS. 1-4, a method for designing a rerouting element 40 that incorporates teachings of the present invention includes identifying a semiconductor device 30 with bond pads 34 to be rerouted, as well as determining the locations of rerouting element 40 to which bond pads 34 are to be rerouted. Accordingly, the design method includes configuring electrically conductive vias 44 of rerouting element 40 to be positioned correspondingly to bond pads 34 of the identified semiconductor device 30. Conductive traces 45 of rerouting element 40 are configured to extend from the locations of corresponding electrically conductive vias 44, with which conductive traces 45 communicate, to a desired, reroute location on a base substrate 41 of rerouting element 40. In addition, contact pads 47 are configured at the desired, reroute locations of base substrate 41.

Returning reference to FIGS. 5 and 8, an assembly method incorporating teachings of the present invention includes providing a carrier substrate 52 and securing a first rerouted semiconductor device 20a' to carrier substrate 52. Rerouted semiconductor device 20a' may be secured to carrier substrate 52 by way of an adhesive material 53 (e.g., a pressure sensitive adhesive, a thermoset resin, a thermoplastic elastomer, etc.) disposed between superimposed regions of rerouted semiconductor device 20a' and carrier substrate 52.

A second semiconductor device, such as the depicted rerouted semiconductor device 20b' or any other semiconductor device including input/output pads that are arranged in a fashion that may be used in stacked multi-chip modules, may be positioned over rerouted semiconductor device 20a'. Rerouted semiconductor device 20b' is depicted as being only partially superimposed over rerouted semiconductor device 20a', with contact pads 47 of the lower rerouted semiconductor device 20a' being exposed beyond an outer periphery 26' of the upper rerouted semiconductor device 20b'. Alternatively, as depicted in FIG. 13, the upper semiconductor device may be substantially superimposed over the lower semiconductor device.

Contact pads 47 of each semiconductor device 20a', 20b' may be electrically connected to and, thus, electrically communicate with corresponding contact areas 54 of carrier substrate 52 by forming or positioning discrete conductive elements 56 between corresponding contact pads 47 and contact areas 54. Such positioning may be effected at any time that appropriate discrete conductive element-forming or -positioning equipment may access contact pads 47, including, without limitation, prior to the placement of a second semiconductor device (e.g., rerouted semiconductor device 20b') over first rerouted semiconductor device 20a' and after the semiconductor devices (e.g., rerouted semiconductor devices 20a' and 20b') have been assembled with one another in stacked relation.

Although the foregoing description contains many specifics, these should not be construed as limiting the scope of the present invention, but merely as providing illustrations of some exemplary embodiments. Similarly, other embodiments of the invention may be devised which do not depart from the spirit or scope of the present invention. Features from different embodiments may be employed in combination. The scope of the invention is, therefore, indicated and limited only by the appended claims and their legal equivalents, rather than by the foregoing description. All additions, deletions, and modifications to the invention, as disclosed herein, which fall within the meaning and scope of the claims are to be embraced thereby.

What is claimed is:

1. A method for designing a rerouting element for use with a semiconductor device including at least one bond pad positioned substantially centrally on a surface thereof, comprising:
   configuring at least one contact location adjacent to a first peripheral edge of a substantially planar member;
   configuring at least one conductive trace location extending from the at least one contact location toward a periphery of the substantially planar member; and
   configuring at least one rerouted bond pad location proximate a second peripheral edge of the substantially planar member opposite the first peripheral edge of the substantially planar member.

2. The method of claim 1, wherein configuring at least one contact location comprises configuring a plurality of contact locations, each contact location of the plurality of contact locations mirroring a location of a corresponding bond pad of the semiconductor device.

3. The method of claim 2, wherein configuring at least one conductive trace location comprises configuring a plurality of conductive trace locations, each conductive trace location of the plurality of conductive trace locations extending from a corresponding contact location toward the periphery of the substantially planar member.

4. The method of claim 3, comprising configuring each conductive trace location of the plurality of conductive trace locations to extend toward a single edge of the substantially planar member.

5. The method of claim 3, wherein configuring at least one rerouted bond pad location comprises configuring a plurality of rerouted bond pad locations, each rerouted bond pad location of the plurality of rerouted bond pad locations being continuous with an end of a corresponding conductive trace location and located proximate the periphery of the substantially planar member.

6. The method of claim 5, comprising configuring each rerouted bond pad location of the plurality of rerouted bond pad locations to be exposed beyond a periphery of another semiconductor device upon positioning of the another semiconductor device over the semiconductor device.

7. The method of claim 1, wherein configuring the at least one rerouted bond pad location comprises configuring the at least one rerouted bond pad location to facilitate connection of a discrete conductive element thereto with another semiconductor device positioned over the semiconductor device.

8. A method for assembling semiconductor devices in a stacked arrangement, comprising:
    providing a semiconductor device with at least one bond pad positioned substantially centrally on a surface thereof; and
    positioning a rerouting element including at least one contact adjacent to a first peripheral edge thereof, at least one rerouted bond pad adjacent to an opposite, second peripheral edge thereof, and at least one conductive trace extending between the at least one contact pad and the at least one rerouted bond pad over the semiconductor device with the at least one contact communicating with the at least one bond pad.

9. The method of claim 8, further comprising:
    positioning another semiconductor device having at least one bond pad positioned substantially centrally on a surface thereof over the rerouting element with the rerouted bond pad being exposed laterally beyond a peripheral edge of the another semiconductor device.

10. The method of claim 9, further comprising:
    positioning another rerouting element over the another semiconductor device with at least one contact of the another rerouting element communicating with the at least one bond pad of the another semiconductor device, a circuit trace of the another rerouting element extending laterally toward another peripheral edge of the another semiconductor device, located opposite the peripheral edge positioned adjacent to the at least one rerouted bond pad, and establishing communication between the at least one bond pad and at least another rerouted bond pad located proximate the another peripheral edge of the another semiconductor device.

11. The method of claim 10, further comprising:
    positioning a third semiconductor device having at least one bond pad positioned substantially centrally on a surface thereof over the second rerouting element with the another rerouted bond pad being located adjacent to and exposed laterally beyond a peripheral edge of the third semiconductor device.

12. The method of claim 11, further comprising:
    positioning a third rerouting element over the surface of the third semiconductor device with a contact of the third rerouting element communicating with the at least one bond pad, a circuit trace of the third rerouting element extending laterally toward another peripheral edge of the third semiconductor device, located opposite the peripheral edge positioned adjacent to the another rerouted bond pad location, and establishing communication between the at least one bond pad and at least one third rerouted bond pad located proximate the another peripheral edge of the third semiconductor device.

13. The method of claim 8, wherein providing the semiconductor device comprises providing a semiconductor device with a plurality of bond pads, at least some of which are positioned at substantially central locations on the surface.

14. The method of claim 13, wherein positioning the rerouting element comprises positioning a rerouting element comprising:
    a plurality of contacts, each contact of the plurality of contacts being positioned correspondingly to a position of a corresponding bond pad of the semiconductor device;
    a plurality of conductive traces, each conductive trace of the plurality of conductive traces extending laterally from a corresponding contact of the plurality of contacts toward the periphery of the semiconductor device; and
    a plurality of rerouted bond pads, each rerouted bond pad of the plurality of rerouted bond pads being positioned at an end of a corresponding conductive trace, proximate the periphery of the semiconductor device.

15. The method of claim 14, wherein positioning the rerouting element comprises positioning a rerouting element with each rerouted bond pad of the plurality of rerouted bond pads being positioned proximate a single peripheral edge of the semiconductor device.

16. The method of claim 14, wherein positioning the rerouting element comprises positioning a rerouting element with each rerouted bond pad of the plurality of rerouted bond pads being positioned to be exposed beyond a periphery of the another semiconductor device upon being positioned over the surface of the semiconductor device.

17. The method of claim 8, further comprising:
    securing the semiconductor device to a carrier substrate.

18. The method of claim 17, wherein securing comprises securing the semiconductor device to at least one of a circuit board, an interposer, an additional semiconductor device, and leads.

19. The method of claim 17, further comprising:
    positioning at least one discrete conductive element between the at least one rerouted bond pad and a corresponding contact area of the carrier substrate.

20. The method of claim 19, wherein positioning comprises at least one of wire bonding, tape-automated bonding, and thermocompression bonding.

21. The method of claim 17, further comprising:
    encapsulating at least portions of the semiconductor device and regions of the carrier substrate adjacent to the semiconductor device.

22. The method of claim 21, wherein encapsulating comprises glob top encapsulating.

23. The method of claim 21, wherein encapsulating comprises one of transfer molding and pot molding.

* * * * *